(12) United States Patent
Kenney et al.

(10) Patent No.: US 8,397,190 B2
(45) Date of Patent: Mar. 12, 2013

(54) METHOD FOR MANIPULATING AND REPARTITIONING A HIERARCHICAL INTEGRATED CIRCUIT DESIGN

(75) Inventors: Robert D. Kenney, Austin, TX (US); Raymond C. Yeung, Round Rock, TX (US); Paul K. Miller, Dripping Springs, TX (US); Donald W. Glowka, Austin, TX (US); Jeffrey B. Reed, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/196,005

(22) Filed: Aug. 2, 2011

(65) Prior Publication Data

US 2012/0192132 A1 Jul. 26, 2012

Related U.S. Application Data

(60) Provisional application No. 61/435,532, filed on Jan. 24, 2011.

(51) Int. Cl.
*G06F 17/50* (2006.01)
(52) U.S. Cl. ........ 716/106; 716/110; 716/124; 716/126; 716/131; 716/132; 716/136; 716/138; 716/139; 703/13; 703/14
(58) Field of Classification Search .................. 716/106, 716/110, 124, 126, 131, 132, 136, 138, 139; 703/13–14
See application file for complete search history.

(56) References Cited

U.S. PATENT DOCUMENTS

| | | | |
|---|---|---|---|
| 6,567,967 B2 * | 5/2003 | Greidinger et al. | 716/108 |
| 6,895,562 B2 | 5/2005 | Rohrbaugh | |
| 6,907,584 B1 * | 6/2005 | Milne et al. | 716/102 |
| 7,340,700 B2 * | 3/2008 | Emerson et al. | 716/111 |
| 7,567,892 B2 * | 7/2009 | Barrett et al. | 703/14 |
| 2009/0030665 A1 | 1/2009 | Kerns | |
| 2010/0235803 A1 * | 9/2010 | Gramark et al. | 716/12 |
| 2011/0029299 A1 | 2/2011 | Zhu | |
| 2011/0035711 A1 | 2/2011 | Gaugler | |
| 2011/0035712 A1 | 2/2011 | Gaugler | |

* cited by examiner

*Primary Examiner* — Nghia Doan
(74) *Attorney, Agent, or Firm* — Lawrence J. Merkel; Meyertons, Hood, Kivlin, Kowert & Goetzel, P.C.; Stephen J. Curran

(57) ABSTRACT

A hardware description language representation of an original circuit block containing one or more hierarchies may be obtained. Some, or all of the hierarchies may be dissolved to access each circuit component within the original circuit block at a same level of hierarchy. Designated circuit components may then be grouped together to create new circuit blocks at a new level of hierarchy. Components and signals within each new circuit block may be renamed to match logically corresponding components and signals within each other new circuit block. Missing pins may be added for each new circuit block, and connected to respective associated signals within the new circuit block, and logically equivalent pins may be given the same name to ensure the new circuit blocks are logically equivalent to each other and have identical interfaces. One of the new circuit blocks may be selected for physical build to obtain one or more physical instances corresponding to the selected new circuit block, and a top-level build may link each new circuit block instance to one of those one or more physical instances.

25 Claims, 6 Drawing Sheets

METHOD FOR MANIPULATING AND REPARTITIONING A HIERARCHICAL INTEGRATED CIRCUIT DESIGN

PRIORITY INFORMATION

This patent application claims priority to Provisional Patent Application Ser. No. 61/435,532, filed Jan. 24, 2011, titled "Method for Manipulating and Repartitioning a Hierarchical Integrated Circuit Design", whose inventors are Robert D. Kenney, Raymond C. Yeung, Paul K. Miller, Donald W. Glowka, and Jeffrey B. Reed, and which is incorporated herein by reference in its entirety as though fully and completely set forth herein.

BACKGROUND

1. Technical Field

This disclosure relates to integrated circuit design, and more particularly to a method for manipulating and repartitioning a hierarchical design.

2. Description of the Related Art

Integrated circuit design flow is a complex process. An important part of the design process is the simulation performed on models of the integrated circuit at various levels of the design hierarchy, for example at system level, logic level, and/or circuit level. The circuit models are oftentimes created with use of a hardware description language (HDL) such as Verilog or VHDL (Very high speed integrated circuits Hardware Description Language). Generally, a synthesis program is used to generate a netlist from the HDL models, making use of standard cell libraries containing a variety of circuit elements from which the integrated circuit may be constructed. Netlists usually include instances of the standard cells contained in the design, with the possible inclusion of custom blocks, and information descriptive of the connectivity between all the instances included in the integrated circuit. There are different types of netlists that can be used, including physical and logical netlists, instance-based and net-based netlists, and flat and hierarchical netlists.

Because the design cycle for integrated circuits is complex and there are many steps, integrated circuits may oftentimes include circuit blocks that are exchanged between designers and design engineers as completed blocks. The completed blocks sometimes have a wrapper or circuit that surrounds the completed circuit block to provide a useable interface, allowing for the circuit block to be seamlessly incorporated into a larger hierarchical design. In many cases, for a variety of reasons, these completed circuit blocks may still need to be manipulated and/or repartitioned, in which case the wrapper around the completed circuit block may also need to be modified. However, many electronic design automation tools such as design/synthesis tools do not perform repartitioning very well, particularly in a hierarchical design, in which various circuit blocks reside at different levels of hierarchy. In many cases, the hardware description language representation of the circuit or the netlist must be modified by hand. This hand editing process can be time consuming and error-prone.

SUMMARY OF THE INVENTION

A circuit block—which may have been obtained from a previous design—is represented in a hardware description language (HDL), and may include a wrapper or boundary logic representing a circuit hierarchy in which one or more preexisting logic blocks reside at the same level of hierarchy, or at a different hierarchical level than the hierarchical level represented by the wrapper. The wrapper may have been created to provide the circuit block as a "black box" entity at the level of hierarchy represented by the wrapper, hiding the internal sub-circuits and sub-blocks, i.e., hiding the preexisting logic blocks and their corresponding signal pins/terminals within the circuit block. The wrapper may allow the circuit block to be integrated into a design hierarchy in which the circuit block may reside at a specified level of hierarchy depending on where the circuit block is integrated. In one set of embodiments, it may be desirable to select/specify various preexisting logic blocks within the circuit block to be grouped together to create new, logically equivalent logic blocks. In one set of embodiments, the HDL representation, for example RTL representation of the circuit block may be loaded into a design tool such as a synthesis and/or compiler tool, and the wrapper around the circuit block may be dissolved by using, for example, an ungroup command in the design tool, to expose the preexisting logic blocks within the circuit block, and if necessary, flattening the entire circuit block, to make the specified preexisting logic blocks accessible at the same level of hierarchy.

Various portions of the flattened circuit block, that is, the specified preexisting logic blocks, may be grouped together to create new logic blocks by using a group command in the design tool, for example. As part of the grouping process, the design tool may create the new logic blocks using the existing unique block names and unique pin names carried over from the previous design, left over from the previous instantiations of the various preexisting logic blocks, as they appeared in the circuit block in the previous design. Thus, in one set of embodiments, each respective preexisting logic block within each newly created logic block may be renamed to match the names of corresponding respective logically identical preexisting logic blocks in a selected one of the newly created circuit blocks. In addition, the generic pin names created for the new logic blocks through the group command may be changed such that the respective logically equivalent pins of all newly created logic blocks are the same. In one sense, the circuit block is repartitioned through designating and grouping together logically identical preexisting logic blocks within the original circuit block. It may be desirable to access the preexisting logic blocks individually, or by creating logically identical new logic blocks by grouping together preexisting logic blocks at a specified level of hierarchy, for routing purposes or layout purposes.

Once the preexisting logic blocks and respective corresponding signals have been renamed, each functionally identical preexisting logic block within the newly created logic blocks may have the same name, and the same may hold true for the signals corresponding to those preexisting logic blocks. For example, the input of a first preexisting logic block within a first newly created logic block and the input of a logically equivalent second preexisting logic block in a second newly created logic block may be the same, while the input of the first preexisting logic block and the input of the logically equivalent second preexisting logic block may both be named the same. Similarly, the output of the first preexisting logic block and the output of the logically equivalent second preexisting logic block may also both be named the same. However, the output signal of a preexisting logic block in one of the newly created logic blocks may not have been connected within the previous hierarchy, and may therefore not correspond to an appropriate pin of the newly created logic block.

Therefore, once all instance names and pin names are the same for each functionally identical preexisting logic block, a check may be performed to ensure that there are no missing pins from any of the newly created logic blocks. If there are missing pins from a newly created logic block, the missing pins may be added to the newly created logic block, connected appropriately to an associated internal signal of the newly created logic block, and named to match the respective logically equivalent pin of the other newly created logic blocks. For example, a pin may be missing from one of the newly created logic blocks because a preexisting logic block contained in the newly created logic block may have had one of its ports unused and floating as previously arranged in the original circuit block. Accordingly, a corresponding pin may be added to the newly created logic block. Furthermore, the added pin may be connected to the previously unconnected port in question, if the newly created logic block is selected for synthesis, as will be further explained below. Overall, once the missing pins have been added, the newly created logic blocks may all be treated as logically equivalent logic blocks.

Once the preexisting logic blocks have been renamed and any missing pins added, one of the newly created logic blocks may be selected for synthesis or custom layout/physical build/implementation as desired. For synthesis, it may be preferable to select a newly created logic block that didn't require added pins as opposed to selecting any of the other newly created logic blocks that did require that at least one pin be added, as the synthesis tool may possibly optimize the underlying circuit(s) in the latter newly created logic block(s) out of the design due to the added pins not being coupled to any internal circuitry of the newly created logic block. Alternately, a newly created logic block with an originally unconnected pin may also be selected for synthesis once the added pin(s) are connected to the corresponding previously unconnected port(s) within the newly created logic block. In one set of embodiments, the newly created logic block selected for synthesis may be synthesized multiple times, each with different settings to obtain different desired physical implementations that may later be instantiated. In alternate embodiments, one or more custom physical builds from the selected newly created logic block may be created, or a combination of custom and synthesized builds may be generated from the selected newly created logic block. Subsequently, the circuit block (i.e. the HDL representation obtained from the previous design) may be synthesized at the top level of hierarchy, with newly created logic blocks formed using preexisting blocks in the same manner as described above. However, rather than synthesizing all the newly created logic blocks, the previously created physical implementations corresponding to the selected newly created logic block may be imported/instantiated for each instance of a newly created logic block, and (new) synthesis may be performed on the higher level(s) of logic.

Figure 1:
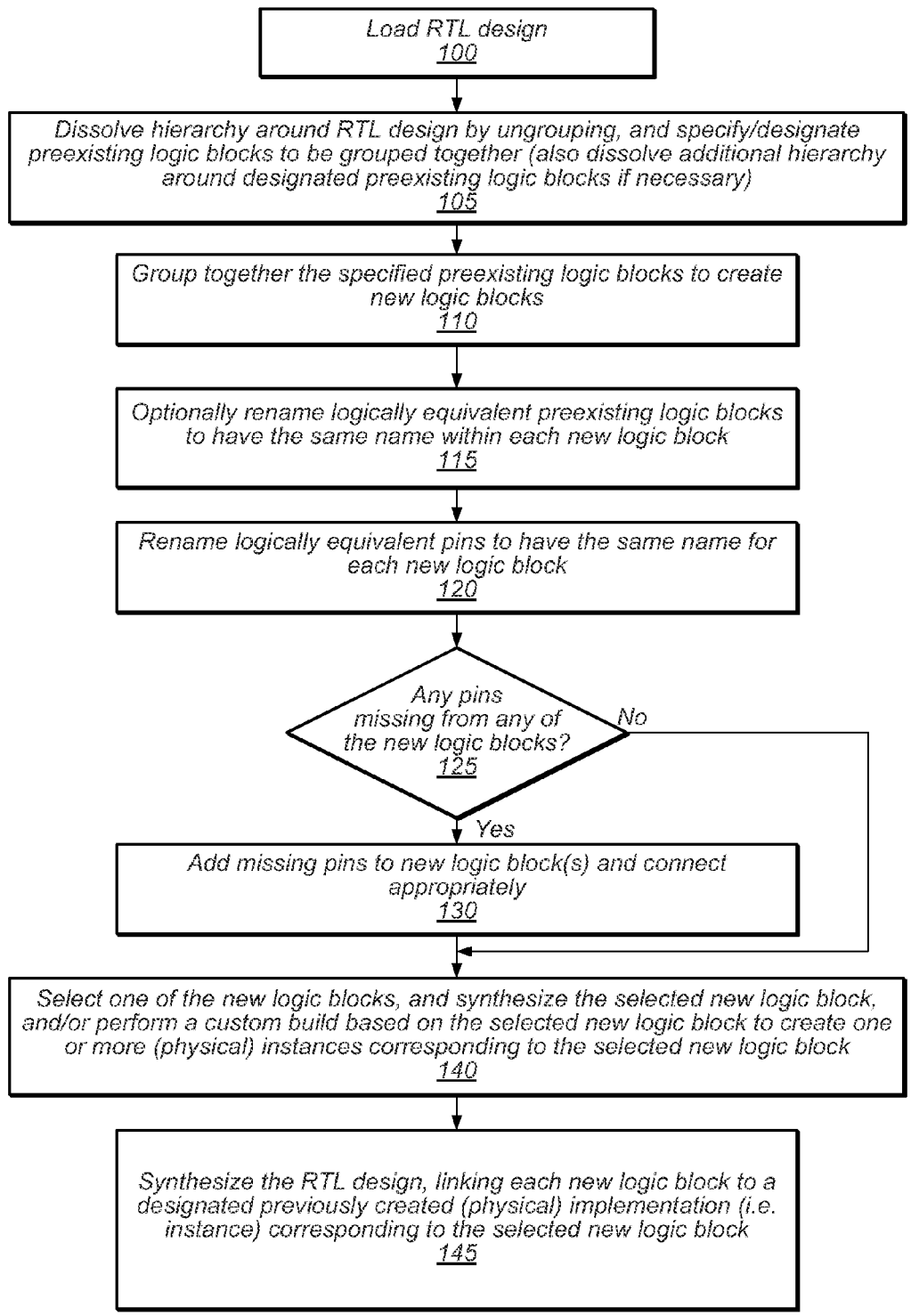
FIG. 1 is a flow diagram depicting an operational flow for manipulating and repartitioning preexisting logic blocks in an integrated circuit design.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

FIG. 1 shows a flow diagram depicting an operational flow for manipulating and repartitioning circuit blocks (i.e., preexisting logic blocks) in an integrated circuit design. As previously mentioned, a circuit block may be provided by one designer, group, or vendor, and may be used as part of a larger circuit design. The circuit block may be provided in various ways. For example, the circuit block may already be placed and routed, in which case the designers have little or no control over the configuration, placement of sub-circuits and preexisting blocks, signal routing, and any of a variety of other characteristics inside the circuit block they receive. This may especially be true in case the already designed block is received in netlist format, that is, in some synthesized form or another. This may happen in case of standard cell design, for example. In other cases, the circuit block may be delivered as register transfer level (RTL) representation of the circuit block, that is, before the register (higher) level model has been synthesized. The RTL representation may be written in a hardware description language (HDL) such as Verilog or VHDL, for example.

In many cases the provided circuit block may include a wrapper or boundary logic around a circuit hierarchy in which one or more levels of preexisting logic blocks reside at different hierarchical levels. The wrapper or boundary logic is typically created to represent the provided circuit block as a "black box" entity, "hiding" the internal sub-circuits and preexisting logic blocks and their corresponding signal pins/terminals, while allowing the provided circuit block to be integrated into a circuit hierarchy, in which the provided circuit block may reside at one of the one or more levels of hierarchy, depending on where the provided circuit block is to be integrated. Accordingly, referring to FIG. 1, starting at 100, the HDL representation, for example RTL representation of the circuit block is loaded into a design tool such as a synthesis and/or compiler tool (one example being the synthesis tool provided by Synopsys). The wrapper around the provided circuit block may be dissolved by using an ungroup command, for example, in the design tool, to expose other levels of hierarchy and preexisting logic blocks within the provided circuit block (referring to 105). Certain preexisting logic blocks may be designated/specified to be grouped together (referring to 105). If the preexisting logic blocks are still at different levels of hierarchy with respect to each other, the wrappers around each group of preexisting logic blocks may be also dissolved such that all designated preexisting logic blocks now reside at the same hierarchical level.

Figures 2, 3:
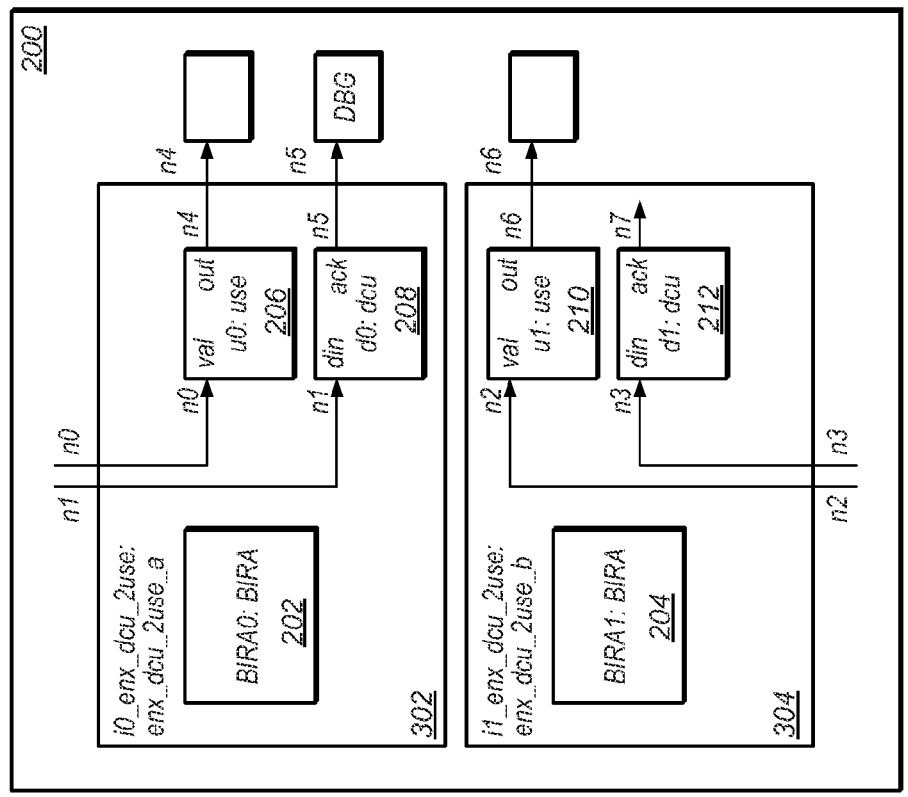
FIG. 2 is a block diagram of an exemplary hierarchical circuit block showing multiple levels of hierarchy.
FIG. 3 is a block diagram depicting the grouping of preexisting logic blocks from the circuit block of FIG. 2 to obtain newly created logic blocks.

An exemplary circuit block 200 is provided in FIG. 2, to illustrate how ungrouping (referenced in 105 of FIG. 1) may work for the given circuit block 200. As seen in FIG. 2, provided circuit block 200 may include preexisting logic blocks 202-212, arranged alongside other logic blocks (not shown) underneath a wrapper formed around all components of circuit block 200. In some embodiments, some of the preexisting blocks may further be arranged within different levels of hierarchy within circuit block 200. For example, as shown in FIG. 2, preexisting logic blocks 202 and 204 may exist within a first level of hierarchy represented by dashed rectangle 201, and preexisting logic blocks 206-212 may exist within a second level of hierarchy represented by dashed rectangle 203. As shown in FIG. 2, preexisting logic blocks 202 and 204 are logically equivalent logic blocks, as are preexisting logic blocks 206 and 210, and preexisting logic blocks 208 and 212 (while not shown, preexisting logic blocks 202 and 204 may be connected to other preexisting logic blocks internally, much the same way preexisting logic block 208, for example, is coupled to a preexisting logic block labeled DBG).

For various reasons, e.g. layout considerations, power management, or similar considerations, it may be desirable to create new logically equivalent logic blocks that each include a preexisting logic block such as preexisting logic block 202, a preexisting logic block such as preexisting logic block 206, and a preexisting logic block such as preexisting logic block 208. In order to create such a new logic block, the component preexisting logic blocks need to be at the same level of hierarchy. Therefore, the hierarchies represented by 201 and 203 may also be dissolved in order to have access to all designated preexisting logic blocks (in this case 202-212) at the same level of hierarchy (as referenced in 105). It should also be noted, that signal "n7" from block 212 is not used, only signal "n6", and as a result, even though preexisting logic blocks 208 and 212 are logically equivalent, their respective instantiations within circuit block 200 are not identical in the sense that preexisting logic block 212 contains an unused signal port. Once the wrapper around circuit block 200 has been dissolved, and the levels of hierarchy represented by 201 and 203 have also been dissolved, the preexisting circuit blocks 202-212 and their respective signal ports are now exposed, all at the same level of hierarchy.

Referring again to FIG. 1, 110 indicates that the designated preexisting logic blocks from the flattened circuit block may be grouped together to create new logic blocks using, for example, a group command in the design tool. Specifically, as seen in FIG. 2, each of preexisting logic blocks 202 and 204 (labeled BIRA) may be grouped with one "use" block (from 206 and 210, respectively) and one "dcu" block (from 208 and 212, respectively) to create two new logic blocks. The new logic blocks are indicated as 302 and 304 in FIG. 3. Specifically, new logic block 302 is created by grouping together preexisting logic blocks 302, 306 and 308, and new logic block 304 is created by grouping together preexisting logic blocks 304, 310 and 312. However, as shown in FIG. 3, the design tool may end up creating the two new logic blocks 302 and 304 with unique block names and unique pin names based on the preexisting logic block names and signal port names as they appeared in the previous design, according to the previous instantiations of the various preexisting logic blocks as they appeared in the provided circuit block 200.

Figure 4:
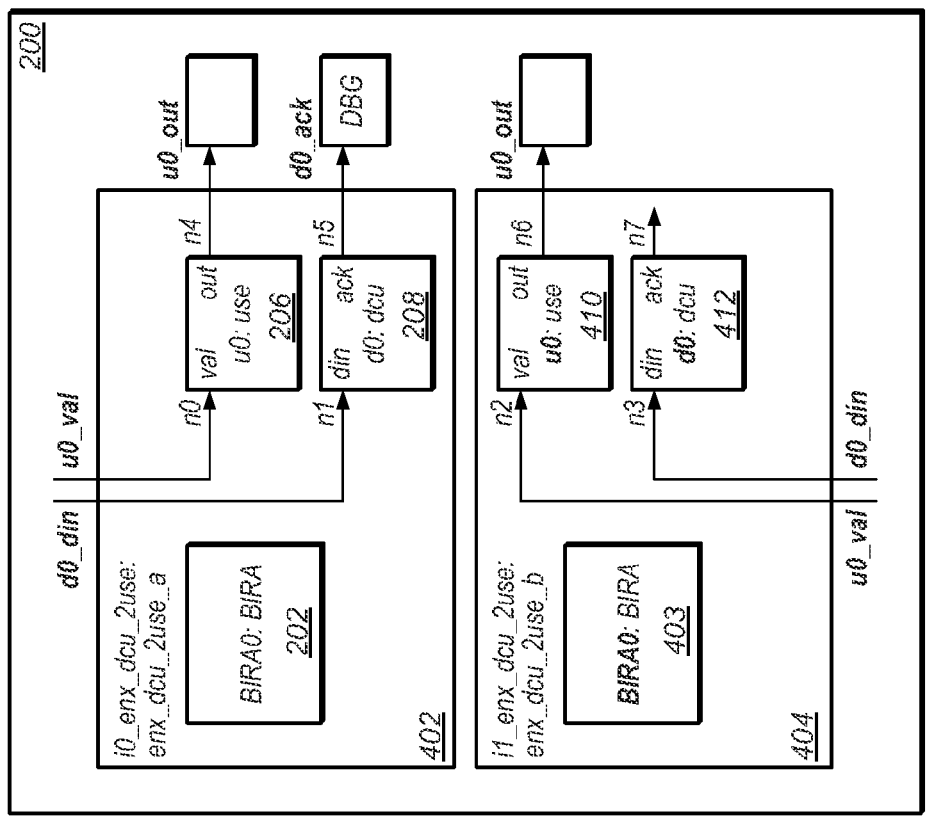
FIG. 4 is a block diagram depicting the renaming of pins and preexisting logic blocks within the newly created logic blocks of FIG. 3.

In one set of embodiments, in order to establish consistency, the respective instance names of each of the preexisting logic blocks within the new logic blocks may be specified to match the respective instance names of corresponding logically identical preexisting logic blocks in a selected one of the new logic blocks (as indicated in 115 of FIG. 1). In other words, logically equivalent preexisting logic blocks may be renamed to have the same name within each new logic block. For example, referring to FIG. 3, the instance name for the 'BIRA' preexisting logic block 204 situated within new logic block 304 may be renamed to match the name of preexisting logic block 202 situated within new logic block 302. This is shown in FIG. 4, where preexisting logic block 403 situated within new logic block 404 has been renamed 'BIRA0: BIRA' to match the name of preexisting logic block 202 situated within new logic block 402. Similarly, preexisting logic blocks 410 and 412 may also be renamed to have their respective names match the respective names of preexisting logic blocks 206 and 208.

In order for the respective interface of each new logic block to be identical to the respective interface of each other new logic block, the pin names assigned to the new logic blocks are renamed in both new logic blocks 402 and 404 such that logically equivalent pins among the new logic blocks have the same name for each new logic block (as referenced in 120 of FIG. 1). As shown in FIG. 4, the logically equivalent preexisting logic blocks within newly created logic block 402 and newly created logic block 404 now have the same names and designations, as well as the same pin/signal names with respect to each other. The names that have been changed with respect to FIG. 3 are shown in bold letters.

The motivation for the changes outlined above may be recapitulated as follows. As previously mentioned, it may be desirable to access the preexisting logic blocks individually, or identical sub-groups within preexisting logic blocks individually—at a specified level of hierarchy—for example to physically build the three preexisting logic blocks (BIRA, use, dcu) as a single entity. The example of a previously provided circuit block, as shown in FIG. 2, includes three pairs of logically equivalent preexisting logic blocks, namely blocks 202 and 204, blocks 206 and 210, and blocks 208 and 212. As these preexisting logic blocks were instantiated within the previously provided circuit block 200, the signal names reflected in the provided RTL representation may be instance names as opposed to the proper signal names corresponding to the preexisting logic blocks at the hierarchical level of the preexisting logic blocks. Thus, once the designated preexisting logic blocks to be grouped together all appear at the same level of hierarchy, and the new logic blocks 302 and 304 have been created as shown in FIG. 3, the newly created logic blocks 302 and 304 respectively contain functionally equivalent (or logically equivalent) preexisting logic blocks when compared to each other, and the preexisting logic blocks within one newly created logic block may be named to match the corresponding functionally identical (or logically equivalent) preexisting logic blocks in other newly created logic blocks.

Thus, each functionally identical preexisting logic block within newly created logic blocks 402 and 404 now has the same name, and so do the pins assigned to those new logic blocks. Specifically, in the example shown in FIG. 4, the input signals to each one of new logic block 402 and new logic block 404 are now named "d0_din" and "u0_val", each corresponding to the appropriate input of the corresponding preexisting logic block. Thus, the input of preexisting logic block 206 and the input of logically equivalent (or functionally identical) preexisting logic block 410 are both named "u0_val", while the input of preexisting logic block 208 and the input of logically equivalent preexisting logic block 412 are both named "d0_din". As shown in FIG. 4, one way the pins may be named is by using the instance name of the preexisting logic block as the first part of the pin name (e.g. u0 for preexisting logic block 206), followed by the instance signal/port name associated with the signal to which the created pin corresponds (e.g. 'val') for signal 'n0' for preexisting logic block 206. However, this is but one naming convention which generates pin names that make it more intuitive to track the pin back to given port/signal names, and other naming conventions are of course possible and may be employed as desired. Similarly, the output of preexisting logic block 206 and the output of logically equivalent preexisting logic block 410 are both named "u0_out", while the output of preexisting logic block 208 is named "d0_ack". However, since the output signal of block 212 was not connected within the originally provided circuit block, a pin corresponding to the output signal of preexisting logic block 412 was not generated as an output pin assigned to newly created logic block 404.

Figure 5:
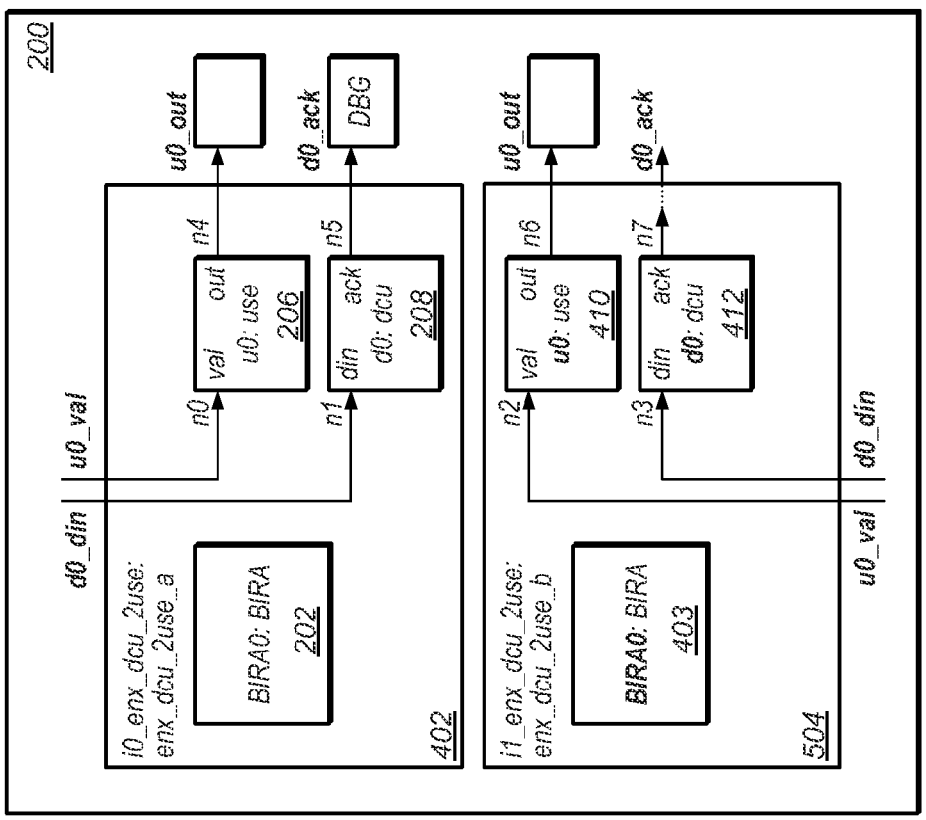
FIG. 5 is a block diagram depicting the adding of missing pins to select newly created logic blocks of FIG. 4.

Therefore, once all pin names for logically (functionally) identical pins are the same for each new logic block (and optionally, all instance names of logically identical preexisting logic blocks are the same within each new logic block), a check may be made to ensure that there are no missing pins from any of the new logic blocks, in this case new logic blocks 402 and 404 (as referenced in 125, in FIG. 1). If there are missing pins from a new logic block, the missing pins may be added to the new logic block, appropriately connected to a corresponding signal port of a preexisting logic block if necessary, and named to match the functionally identical pin in other new logic blocks (as indicated in 130, in FIG. 1). For example, referring to FIG. 4, the "d0_ack" pin is missing from new logic block 404 because the "n7" port from the instantiated "dcu" circuit block 212 in previously provided circuit block 200 was not used and was floating. Accordingly, as shown in FIG. 5, the "d0_ack" pin may be added to obtain new logic block 504, which would make the respective interfaces of new logic blocks 402 and 504 fully equivalent at the level of hierarchy of new logic blocks 402 and 504.

However, even though new logic blocks 402 and 504 may be logically equivalent and have identical interfaces at the level of hierarchy where new logic blocks 402 and 504 appear, if these two new logic blocks were to be synthesized, the resulting physical implementations would differ. Therefore, optionally, the "d0_ack" pin of new logic block 504 may be connected to the internal "n7" port of block 412, as indicated by the dashed line, to ensure that physical implementations of new logic blocks 402 and 504 are also logically equivalent. However, as will be further discussed below, this may not be necessary when synthesizing and/or custom building corresponding physical implementations of a fully connected new logic block (e.g. new logic block 402) individually, and subsequently linking other new logic blocks to the already synthesized block during synthesis of the entire circuit block 200 and/or during synthesis of the larger integrated circuit in which circuit block 200 may be included.

Figure 7:
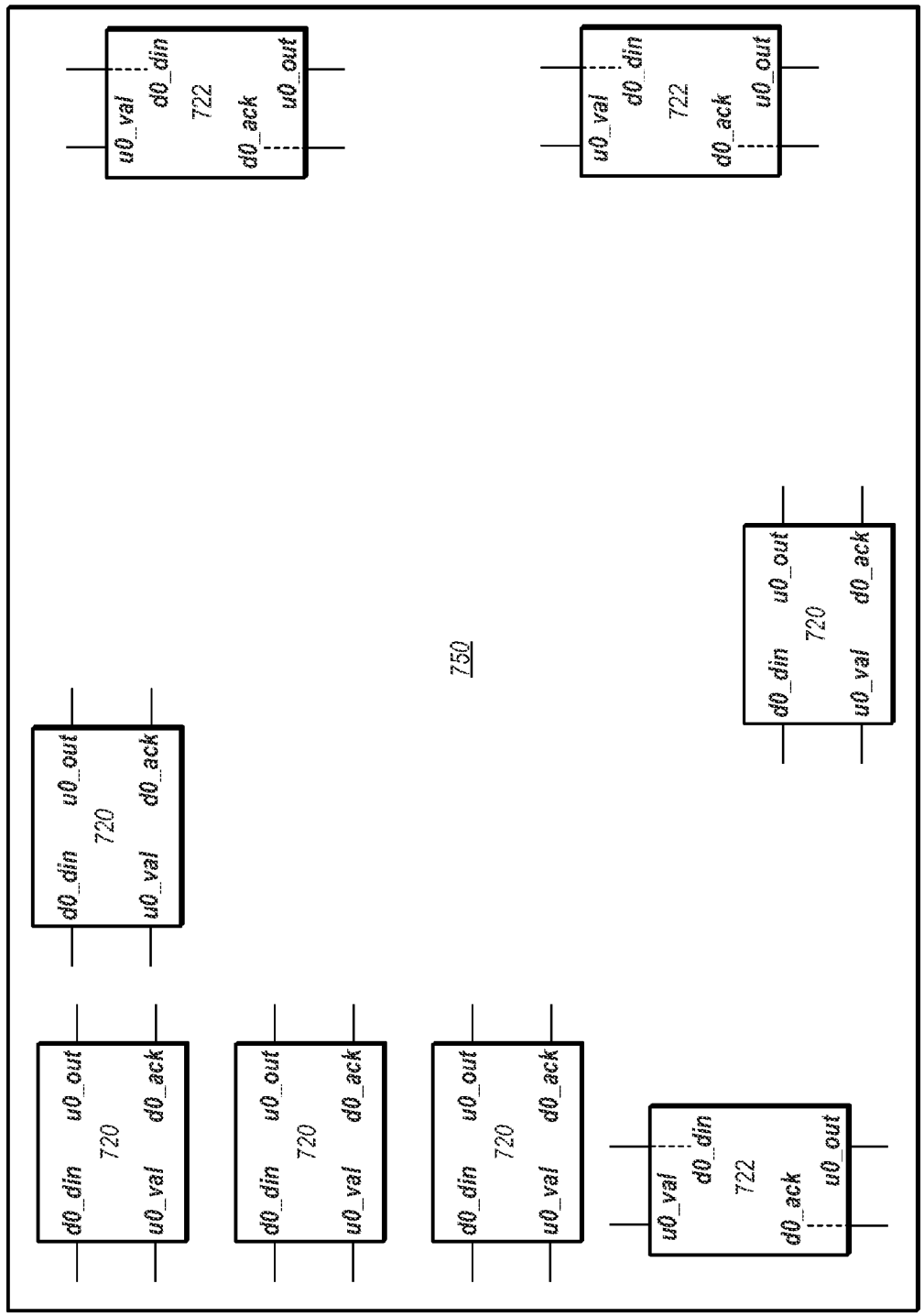
FIG. 7 is a block diagram depicting how multiple instances of previously synthesized physical implementations of the same newly created logic block may be arranged in the integrated circuit design.

As referenced in 140 of FIG. 1, one of the new logic blocks, preferably a fully connected new logic block, such as new logic block 402 may be selected and synthesized individually, and/or one or more custom implementations of the selected new logic block may be built to create one or more corresponding (physical) implementations of the selected new logic block. The corresponding implementations may be created based on various criteria and using different settings, later providing (physical) builds that may be linked to when performing a build of the entire circuit block 200. One reason for creating more than one build of the selected new logic block is to have access to alternative implementations as may be required for maximum flexibility in arranging the new logic blocks within a design, as shown in the example of FIG. 7 which will be further described below. Once the desired one or more builds of the selected new logic block have been created, various instances of the new logic blocks may be linked to the physical instance/build obtained in 140 during synthesis of the entire design, which may entail synthesis of circuit block 200 or it may entail the synthesis of the entire circuit block 200.

Figure 6:
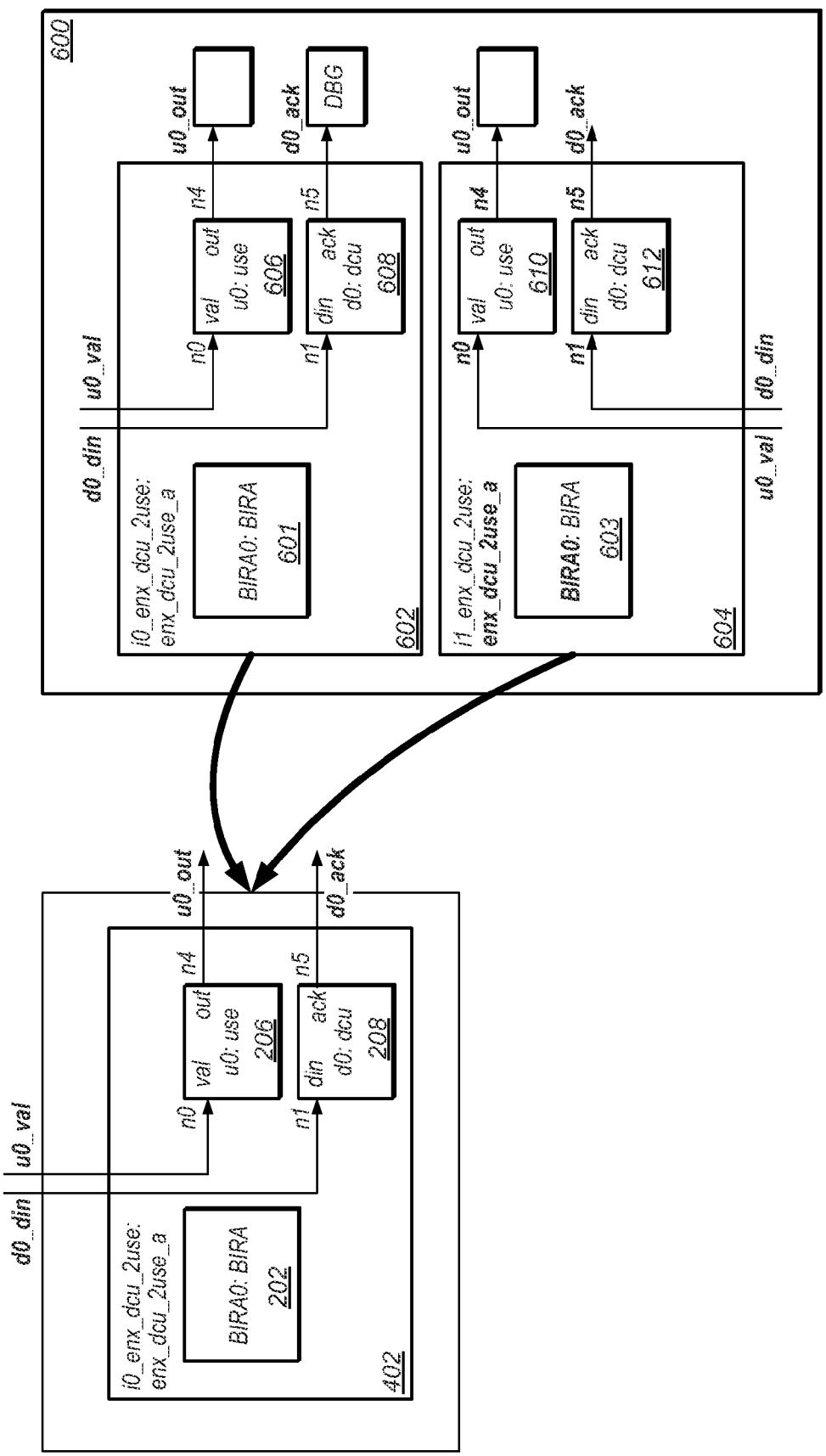
FIG. 6 is a block diagram depicting how a previously synthesized physical implementation of one of the newly created logic blocks of FIG. 5 is instantiated multiple times via changed links for higher level synthesis.

In one embodiment, this may be accomplished through a "change_link" command. More particularly, as shown in FIG. 6, when performing a top-level build, new logic block 504 may actually be instantiated by linking to the circuit block build of new logic block 402, named "enx_dcu_2use_a" (as referenced in 145 of FIG. 1). Since the new logic blocks are all logically equivalent, the same build/physical model may be used for both instances 602 and 604 when performing a top-level build. Accordingly, as shown in FIG. 6, instance 604, corresponding to new logic block 504, and instance 602, corresponding to new logic block 402, may both be pointing to a physical build/instance of new logic block 402. As previously mentioned, in this way, if the aspect ratio or the orientation needs to be changed for any of the new logic blocks, the designer may instantiate the new build or builds as needed, without requiring changes to each new logic block during top level synthesis.

As mentioned above, a new logic block with no added pins may be selected for synthesis. This may be preferable to selecting one of the other new logic blocks that may have unconnected pins, as the synthesis tool may possibly optimize the underlying circuit in the other new logic block out of the design due to the added pins not being used. As also previously mentioned, more than one build may be generated based on the selected new logic block (e.g. new logic block 402), whether through synthesis or custom build, to provide flexibility based on various potential layout and/or power requirements, or other requirements associated with the top level design. For example, as seen in FIG. 7, an overall design 750 may include multiple instances of new logic blocks created as shown for example in FIGS. 3-5. In the example shown in FIG. 7, two different physical implementations or builds of new logic block 402 have been created, namely build 720 and build 722. For example, build 720 may differ from build 722 based on the intended orientation of the new logic block within the overall design. Overall design 750 in FIG. 7 is provided for illustrative purposes, therefore other possible components and specific connectivity of instances 720 is not shown.

It should be noted that one or more of the steps performed in the flow diagram of FIG. 1, may be performed using script files that execute either as a stand alone design tool or as part of and within a synthesis tool. More particularly, when a script is used as part of an existing synthesis design tool, the commands such as ungroup, group, and change_link may be different depending on the specific design tool. Furthermore, while 145 in FIG. 1 references synthesizing the RTL design and linking each new logic block to a designated previously synthesized or custom built (physical) implementation (i.e. instance) that corresponds to the selected new logic block, in various alternate embodiments each new logic block may be synthesized during top-level synthesis, and ultimately arranged as desired in a final layout. In all cases, grouping of preexisting logic blocks accessed at the same level of hierarchy may be performed to obtain new logic blocks for the purposes of arranging/laying out the overall design as desired.

Figure 8:
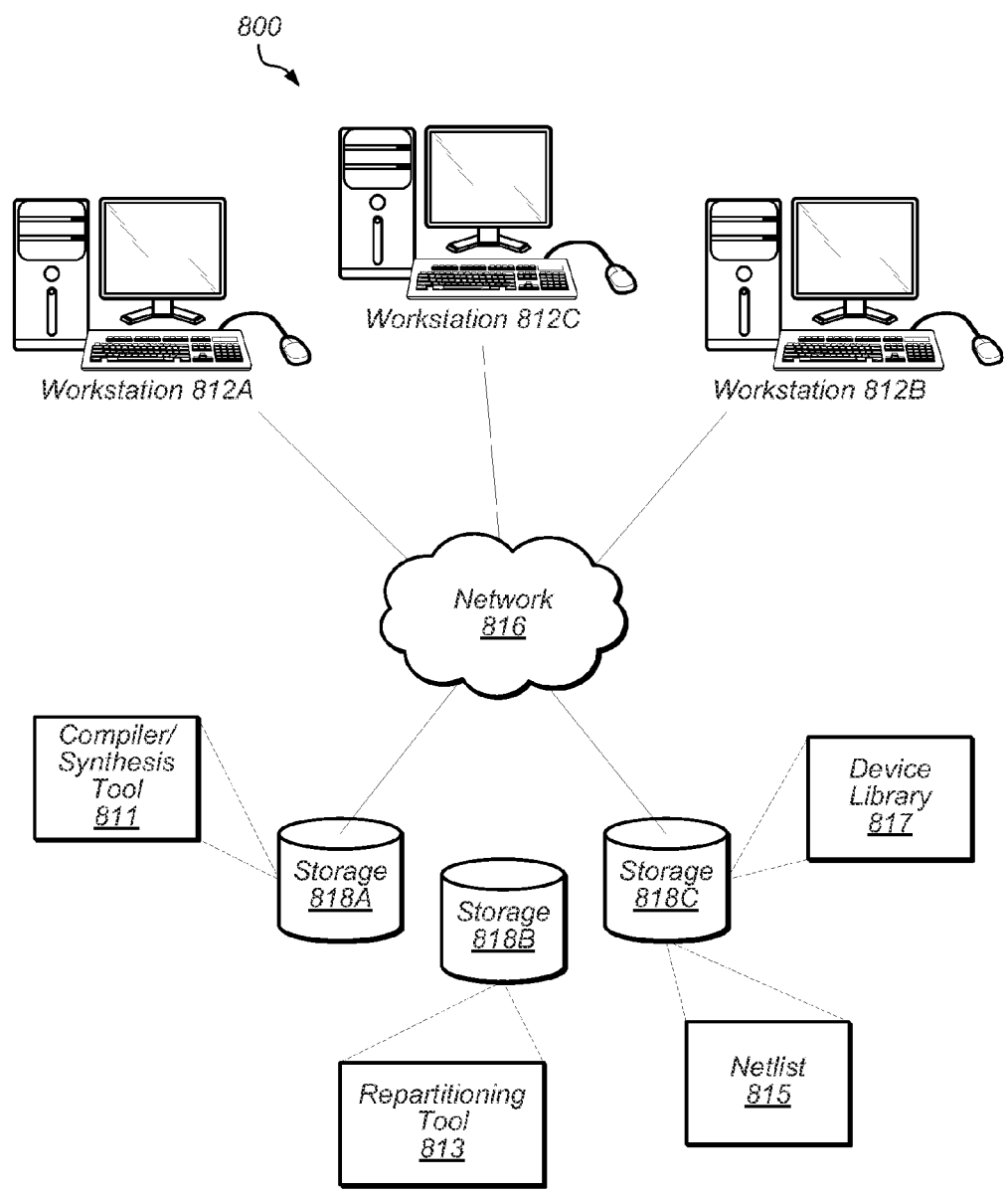
FIG. 8 is a block diagram of one embodiment of a computer system used to implement a design tool.

FIG. 8 shows a block diagram of one embodiment of a computer system used to implement a design tool for manipulating and repartitioning a hierarchical integrated circuit design. The computer system 800 includes a plurality of workstations designated 812A through 812C. The workstations are coupled together through a network 816 and to a plurality of storages designated 818A through 818C. In one embodiment, each of workstations 812A-812C may be representative of any standalone computing platform that may include, for example, one or more processors, local system memory including any type of random access memory (RAM) device, monitor, input output (I/O) means such as a network connection, mouse, keyboard, monitor, and the like (many of which are not shown for simplicity).

In one embodiment, storages 818A-818C may be representative of any type of mass storage device such as hard disk systems, optical media drives, tape drives, ram disk storage, and the like. As such, the program instructions comprising the design tools may be stored within any of storages 818A-818C and loaded into the local system memory of any of the workstations during execution. As an example, as shown in FIG. 8, the compiler/synthesis tool 811 is stored within storage 818A, while the repartitioning tool (e.g. when the repartitioning tool is a standalone script(s) and or program suite) 813 is shown stored within storage 818B, and the netlist 815 and the device library 817 are stored within storage 818C. Additionally, the program instructions may be stored on a portable/removable storage media. The program instructions may be executed directly from the removable media or transferred to the local system memory or mass storages 818 for subsequent execution. As such, the portable storage media, the local system memory, and the mass storages may be referred to as non-transitory computer readable storage mediums. The program instructions may be executed by the one or more processors on a given workstation, or they may be executed in a distributed fashion among the workstations, as desired.

It is noted that although the computer system shown in FIG. 8 is a networked computer system, it is contemplated that in other embodiments, each workstation may also include local mass storage. In such embodiments, the program instructions and the results of the design tools may be stored locally. Furthermore, it is contemplated that the program instructions may be executed on a standalone computer such as a personal computer that includes local mass storage and a system memory. Generally, the program instructions may be executed on any platform and/or hardware configuration conducive to storing and manipulating data and programming instructions. In some embodiments, application specific hardware modules may also be designed if desired, to implement any or all of the elements of the processes described herein, for which such implementation is possible.

Various embodiments described above provide examples of a method for manipulating a circuit design having a given hierarchy, and repartitioning that hierarchy to create new hierarchies. The method includes dissolving the original hierarchy, and creating new hierarchies that have the same pinout and are logically equivalent to each other, thereby providing modularity that previously didn't exist within a design.

By manipulating and repartitioning a previously designed and provided circuit block as described above with respect to various embodiments, a designer may effectively modularize blocks so that a single block may be synthesized and/or custom built/implemented and then instantiated numerous times. Otherwise, circuits that could have been modularized would have to be synthesized as part of the overall design, making the synthesis process longer, more complex, and leaving the designer with fewer options during layout. In addition, a flat synthesis oftentimes provides poorer quality results. It should be noted that the design flow described herein may be used for creating new logic blocks at a new level of hierarchy, and subsequently generating/building corresponding physical implementations/instances in a custom or semi-custom format (i.e. not necessarily with a synthesis tool). The flow described herein may therefore be used to reorganize an original, previously existing design hierarchy, and instantiate fully custom implemented blocks (both sub-blocks and top-level logic) where no such blocks existed before.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A method comprising:
   receiving a hardware description language (HDL) representation of a circuit block of an integrated circuit (IC), wherein the circuit block comprises a plurality of preexisting logic blocks;
   performing, by a processor:
   dissolving one or more hierarchical wrappers of the circuit block to access designated preexisting logic blocks of the plurality of preexisting logic blocks at a same level of hierarchy;
   creating new logic blocks, comprising:
      grouping together specified preexisting logic blocks of the designated preexisting logic blocks for each new logic block, wherein the specified preexisting logic blocks within each new logic block are logically equivalent to the specified preexisting logic blocks within each other new logic block;

creating a respective hierarchical wrapper around each new logic block, comprising assigning a respective set of pins to each new logic block; and renaming logically equivalent pins within the respective sets of pins to have a same name for each new logic block, to provide identical respective interfaces for the new logic blocks;

wherein each of the new logic blocks is logically equivalent to each other new logic block.

2. The method of claim 1, further comprising renaming the specified preexisting logic blocks and their associated signals within each new logic block to have a same name within each new logic block.

3. The method of claim 2, further comprising connecting at least a subset of the associated signals within each newly created logic block to respective pins of the respective set of pins assigned to the new logic block.

4. The method of claim 1, further comprising designating at least one respective pin of the respective set of pins assigned to at least one new logic block to correspond to a respective signal associated with one of the specified logic blocks, within the at least one new logic block, wherein the respective signal was not previously connected to any other circuit element.

5. The method of claim 4, further comprising connecting the respective signal to the at least one respective pin.

6. The method of claim 1, further comprising selecting one of the new logic blocks for physical build, wherein all active signals associated with the specified preexisting logic blocks within the selected new logic block are connected to corresponding respective pins of the respective set of pins assigned to the selected logic block.

7. The method of claim 6, further comprising:
generating one or more physical instances corresponding to the selected new logic block by performing one or more of:
synthesizing the selected new logic block; or
custom building one or more of the one or more physical instances corresponding to the selected new logic block; and
synthesizing the circuit block of the integrated circuit, comprising linking each instance representing a new logic block to one of the one or more physical instances corresponding to the selected new logic block.

8. A method comprising:
receiving a hardware description language (HDL) representation of a circuit block of an integrated circuit (IC), wherein the circuit block comprises a plurality of preexisting logic blocks configured within one or more existing hierarchies within the circuit block;
performing, by a processor:
dissolving the one or more existing hierarchies to access each preexisting logic block of the plurality of preexisting logic blocks at a same level of hierarchy; and
creating a plurality of new hierarchies within the circuit block by grouping together respective sets of preexisting logic blocks of the plurality of preexisting logic blocks, wherein the specified preexisting logic blocks within each new logic block are logically equivalent to the specified preexisting logic blocks within each other new logic block, and creating a respective wrapper corresponding to each new hierarchy;
wherein each new hierarchy of the plurality of new hierarchies is logically equivalent to each other new hierarchy of the plurality of new hierarchies, and comprises an identical interface.

9. The method of claim 8, wherein creating the plurality of new hierarchies comprises renaming each preexisting logic block and its associated signals within each new hierarchy to match logically equivalent preexisting logic blocks and their associated signals across the plurality of new hierarchies.

10. The method of claim 8, wherein creating the plurality of new hierarchies comprises connecting at least a subset of respective signals within the new hierarchy to respective corresponding pins assigned to the respective wrapper corresponding to the new hierarchy.

11. The method of claim 10, wherein the respective pins assigned to the respective wrapper corresponding to the new hierarchy comprise at least one respective pin connected to a respective signal within the new hierarchy that was not previously connected to any other circuit element.

12. The method of claim 10, further comprising selecting for synthesis one of the plurality of new hierarchies for physical build, wherein the respective pins assigned to the respective wrapper corresponding to the selected new hierarchy are all connected to a corresponding respective signal within the selected new hierarchy.

13. A system comprising:
one or more processing units configured to execute programming instructions; and
one or more memory elements configured to store programming instructions executable by the one or more processing units to:
receive a hardware description language (HDL) representation of a first circuit block at one or more levels of hierarchy;
dissolve one or more of the one or more levels of hierarchy of the first circuit block to access preexisting logic components within the first circuit block at a same level of hierarchy; and
create a plurality of new logic blocks at a specified level of hierarchy by grouping together respective ones of the preexisting logic components, wherein the specified preexisting logic blocks within each new logic block are logically equivalent to the specified preexisting logic blocks within each other new logic block, and to create a respective wrapper around each new block;
wherein each new logic block of the plurality of new logic blocks is fully logically equivalent to each other new logic block of the plurality of new logic blocks, and has a respective interface identical to respective interfaces of each other new logic block.

14. The system of claim 13, wherein the one or more memory elements are further configured to store programming instructions executable by the one or more processing units to:
rename respective components and signals within each new logic block to match corresponding respective logically equivalent components and signals within each other new logic block.

15. The system of claim 13, wherein
at least a subset of respective signals within the new logic block are assigned to respective pins of the respective wrapper around the new logic block, to provide access to the at least a subset of the respective signals outside the new logic block.

16. The system of claim 15, wherein the respective pins of the respective wrapper around the new logic block comprise at least one respective pin assigned to a respective signal of the at least a subset of the respective signals within the new logic block, wherein the respective signal was previously not connected to any other circuit element within the first circuit block.

17. The system of claim 15, wherein the one or more memory elements are further configured to store programming instructions executable by the one or more processing units to:
select one of the plurality of new logic blocks for physical build, wherein the respective pins of the respective wrapper around the selected new logic block are all connected to respective assigned signals within the selected new logic block.

18. The system of claim 15, wherein the one or more memory elements are further configured to store programming instructions executable by the one or more processing units to:
select one of the plurality of new logic blocks for physical build, wherein all respective signals within the selected new logic block are assigned to respective pins of the respective wrapper around the selected new logic block.

19. A non-transitory computer readable memory medium configured to store programming instructions executable to:
receive a hardware description language (HDL) representation of a first circuit block encapsulated in one or more wrappers representative of corresponding levels of hierarchy;
remove one or more of the one or more wrappers to access each circuit component within the first circuit block at a same level of hierarchy; and
group together respective circuit components of the first circuit block to create a plurality of new circuit blocks, wherein the respective circuit components within each new circuit block are logically equivalent to the respective circuit components within each other new circuit block, and create a respective new wrapper around each new circuit block, wherein the respective new wrapper is representative of a specified level of hierarchy;
wherein each new circuit block of the plurality of new circuit blocks is logically equivalent to each other new circuit block of the plurality of new circuit blocks, and has a respective interface identical to respective interfaces of each other new circuit block.

20. The non-transitory computer readable memory medium of claim 19, further configured to store programming instructions executable to:
rename respective components within each new circuit block to match respective components within each other new circuit block.

21. The non-transitory computer readable memory medium of claim 19, further configured to store programming instructions executable to:
create a respective set of pins for each respective new wrapper;
wherein at least a subset of respective signals within each new circuit block are associated with respective pins of the respective set of pins created for the respective new wrapper, to provide access to the at least a subset of the respective signals outside the new circuit block.

22. The non-transitory computer readable memory medium of claim 19, further configured to store programming instructions executable to:
create a respective set of pins for each respective new wrapper; and
connect designated signals, which are provided to and by the respective circuit components configured within the new logic blocks, to corresponding respective pins of the respective sets of pins of the respective new wrappers created around the new logic blocks, wherein the designated signals were previously not connected to other circuit elements within the first circuit block.

23. The non-transitory computer readable memory medium of claim 19, further configured to store programming instructions executable to:
create a respective set of pins for each respective new wrapper;
select one of the new circuit blocks;
connect all pins of the respective set of pins of the respective new wrapper around the selected new circuit block to corresponding respective signals within the selected new circuit block; and
generate one or more physical instances corresponding to the selected new circuit block, comprising one or more of:
synthesize the selected new circuit block; or
custom build one or more of the one or more physical instances corresponding to the selected new circuit block.

24. The non-transitory computer readable memory medium of claim 23, further configured to store programming instructions executable to:
synthesize the first circuit block, comprising linking each instance of the new circuit block to one of the one or more physical instances corresponding to the selected new circuit block.

25. The non-transitory computer readable memory medium of claim 19, further configured to store programming instructions executable to:
create a respective set of pins for each respective new wrapper;
select one of the new circuit blocks;
connect all respective signals within the selected new circuit block to respective pins of the respective set of pins of the respective new wrapper around the selected new circuit block; and
generate one or more physical instances corresponding to the selected new circuit block, comprising one or more of:
synthesize the selected new circuit block; or
custom build one or more of the one or more physical instances corresponding to the selected new circuit block.

* * * * *